Figure 1:
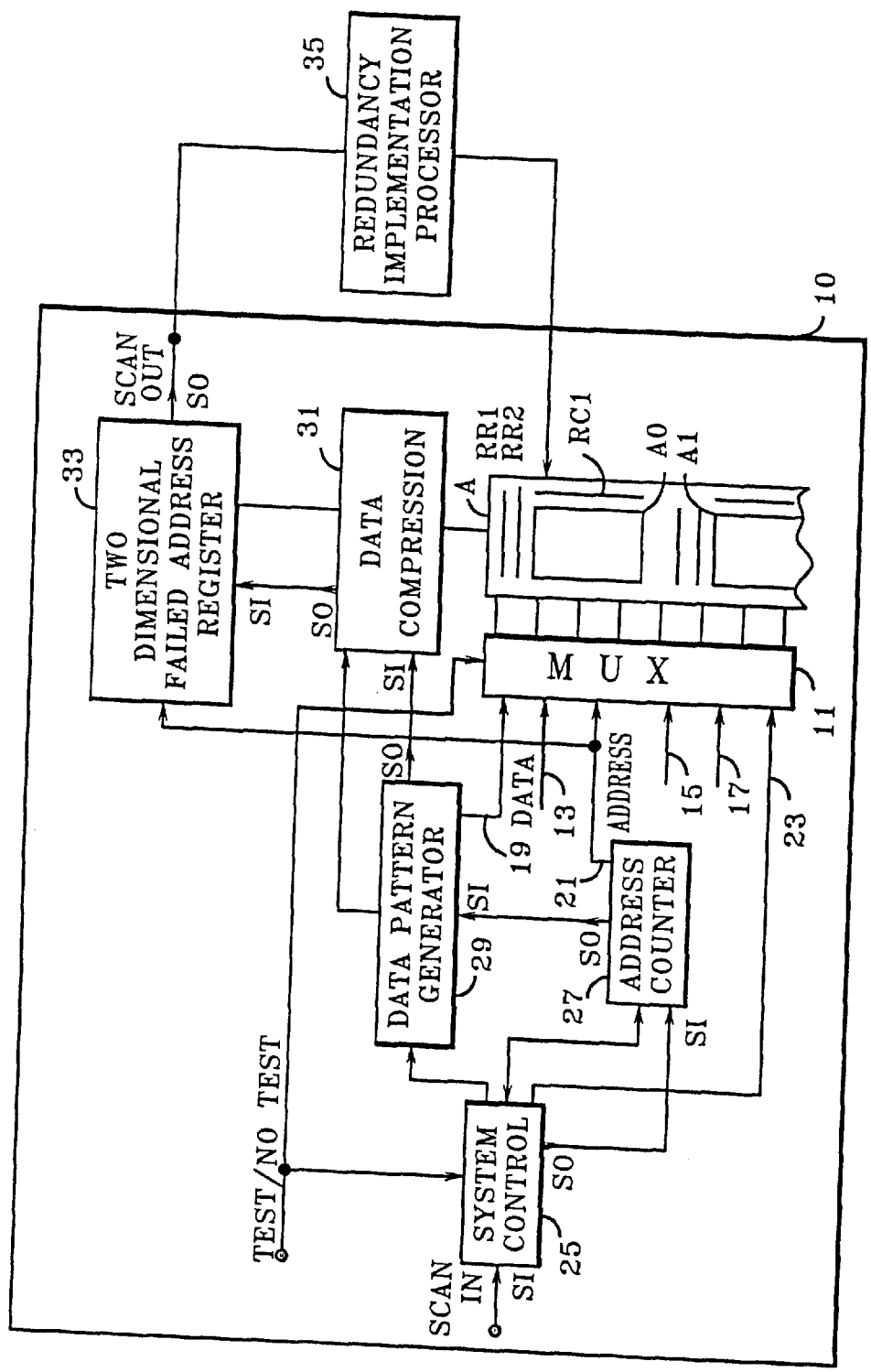

United States Patent

Hedberg et al.

[11] Patent Number: 5,859,804
[45] Date of Patent: Jan. 12, 1999

[54] METHOD AND APPARATUS FOR REAL TIME TWO DIMENSIONAL REDUNDANCY ALLOCATION

[75] Inventors: Erik Leigh Hedberg, Essex Junction; Garrett Stephen Koch, Jeffersonville, both of Vt.

[73] Assignee: International Business Machines Corporation, Armonk, N.Y.

[21] Appl. No.: 938,757

[22] Filed: Sep. 26, 1997

Related U.S. Application Data

[62] Division of Ser. No. 777,877, Oct. 16, 1991.

[51] Int. Cl.$^6$ ........................................ G11C 7/00
[52] U.S. Cl. ..................... 365/201; 365/200; 371/10.3; 371/21.1
[58] Field of Search ................... 365/200, 201; 371/10.2, 10.3, 21.1

[56] References Cited

U.S. PATENT DOCUMENTS

| | | |
|---|---|---|
| 4,389,715 | 6/1983 | Eaton, Jr. et al. . |
| 4,460,997 | 7/1984 | Harns . |
| 4,460,999 | 7/1984 | Schmidt . |
| 4,586,178 | 4/1986 | Bosse . |
| 4,601,019 | 7/1986 | Shah et al. . |
| 4,736,373 | 4/1988 | Schmidt . |
| 4,751,656 | 6/1988 | Conti et al. . |
| 4,829,480 | 5/1989 | Seo . |
| 4,937,790 | 6/1990 | Sasaki et al. . |
| 4,939,694 | 7/1990 | Eaton et al. . |
| 5,005,158 | 4/1991 | McClure et al. ................. 365/200 |
| 5,173,906 | 12/1992 | Dreibelbis et al. . |

OTHER PUBLICATIONS

European Patent Application 0 242 854, published Oct. 28, 1987.

*Primary Examiner*—Huan Hoang
*Attorney, Agent, or Firm*—Robert A. Walsh

[57] ABSTRACT

A method and apparatus are provided in an array built in self test (ABIST) environment formed on a semiconductor chip having an array of memory cells arranged in columns and rows and column and row redundant lines which includes testing the array along the columns to identify a given number of faulty cells in each of the columns, storing the column addresses having the given number of faulty cells in first registers, further testing the array along the columns or rows to identify any additional faulty cells while masking the cells having the stored column addresses and storing the row addresses having the faulty cell in second registers until all of the second registers store row addresses, and after all of the second registers store row addresses, continue testing the array while masking the cells having the stored column or row addresses and storing the column addresses of any remaining additional faulty cell in any unused register of the first registers.

4 Claims, 8 Drawing Sheets

5,859,804

METHOD AND APPARATUS FOR REAL TIME TWO DIMENSIONAL REDUNDANCY ALLOCATION

CROSS-REFERENCES TO RELATED APPLICATIONS

This Application is a division of U.S. patent application Ser. No. 07/777,877 filed Oct. 16, 1991 which Application is now pending.

TECHNICAL FIELD

This invention relates to a method and apparatus for efficient real time two dimensional redundancy allocation or identification of redundant or replacement column lines for unacceptable memory array column lines and of redundant or replacement row lines for unacceptable memory array row lines formed in a semiconductor wafer or chip as the array column and row lines are being tested.

BACKGROUND ART

As the number of circuits, particularly random access memory cells, on a semiconductor chip have increased, column and row redundant lines have been installed on the chip to enhance product yield. A chip that integrates various kinds of circuits including logic circuits having memory arrays embedded therein pose special problems for the circuit designer/tester who desires adequate testability of the embedded array since such chips have fewer input/output pins available to the circuit tester than is available in a chip having a stand alone memory.

To lower the cost of making memories by reducing testing expenses and improving memory yields, systems have been disclosed which are self testing and self repairing. One such system, sometimes known as an array built in self testing (ABIST) system, is taught in U.S. Pat. No. 4,939,694, issued on Jul. 3, 1990, which uses substitute address tables and error correction code (ECC) techniques for correcting errors found in the memory cells. Another ABIST system, disclosed in European Patent No. 0 242 854, published on Oct. 28, 1987, replaces defective memory cells of a semiconductor memory with spare memory cells using an associative memory. A further ABIST system is disclosed in U.S. patent application entitled "Built-In Self Test for Integrated Circuits" and having Ser. No. 07/576646, filed on Aug. 30, 1990, by E. L. Hedberg et al, now U.S. Pat. No. 5,173,906 wherein one dimensional failed address registers are used to store word addresses of defective cells of a memory array, i.e., redundant lines are used which extend in only one dimension.

To further improve memory chip yields, testing systems have been disclosed for testing chips having a memory matrix or array and spare or redundant columns and rows of memory elements to be used for repair of the matrix or array under test. One such tester is disclosed in U.S. Pat. No. 4,460,997, issued on Jul. 17, 1984, wherein defective cells detected or flagged when scanning in one direction, e.g., along a row, during test, are masked when scanning in the other direction, e.g., along a column, so as not to be counted as a defective cell twice. In commonly assigned U.S. Pat. No. 4,751,656, issued on Jun. 14, 1988, there is disclosed a method for choosing replacement lines in a two dimensionally redundant array wherein if the number of cell failures along a row exceeds the number of redundant columns, then that row is replaced with one of the redundant rows.

DISCLOSURE OF THE INVENTION

It is an object of this invention to provide an improved array built in self testing (ABIST) system on a semiconductor chip wherein two dimensional redundant lines are directly allocated by the ABIST system in real time during final manufacture testing to increase semiconductor chip yields without degrading array performance and to reduce tester costs.

In accordance with the teachings of this invention, method and apparatus are provided in an ABIST environment formed on a semiconductor chip having an array of memory cells arranged in columns and rows and column and row redundant lines which includes testing the array in one direction, e.g., along the columns, to identify a given number of faulty cells in each of the columns, storing the column addresses having the given number of faulty cells in first registers, further testing the array either along rows or columns to identify any additional faulty cells while masking the cells having the stored column addresses and storing the row addresses having the faulty cells in second registers until all of the second registers store row addresses, and after all of the second registers store row addresses, continue testing the array along either the rows or columns while masking the cells having the stored column or row addresses and storing the column address of any remaining additional faulty cell in any unused register of the first registers.

The foregoing and other objects, features and advantages of the invention will be apparent from the following more particular description of the preferred embodiments of the invention, as illustrated in the accompanying drawings.

BRIEF DESCRIPTION OF THE INVENTION

Figure 2:
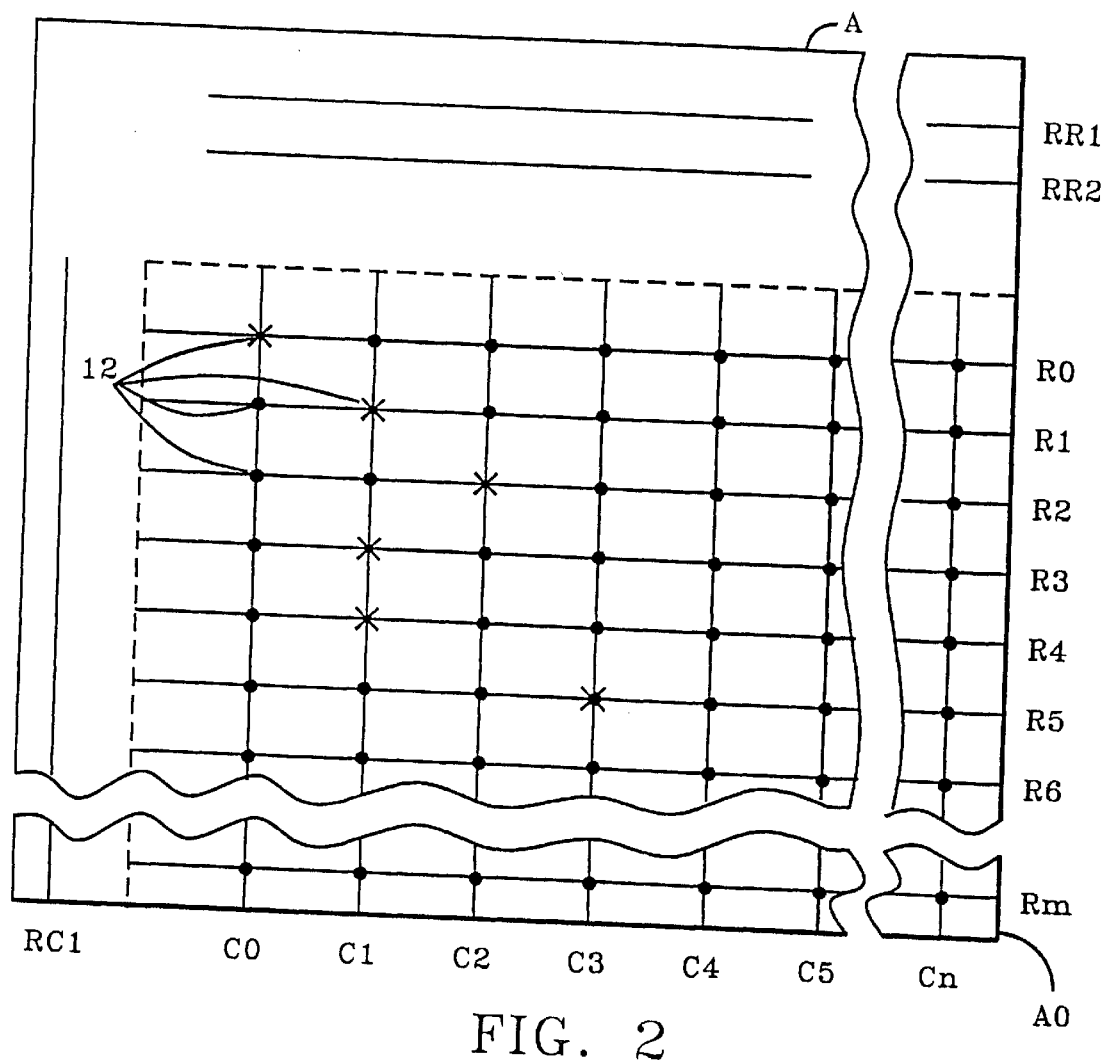
Figure 3:
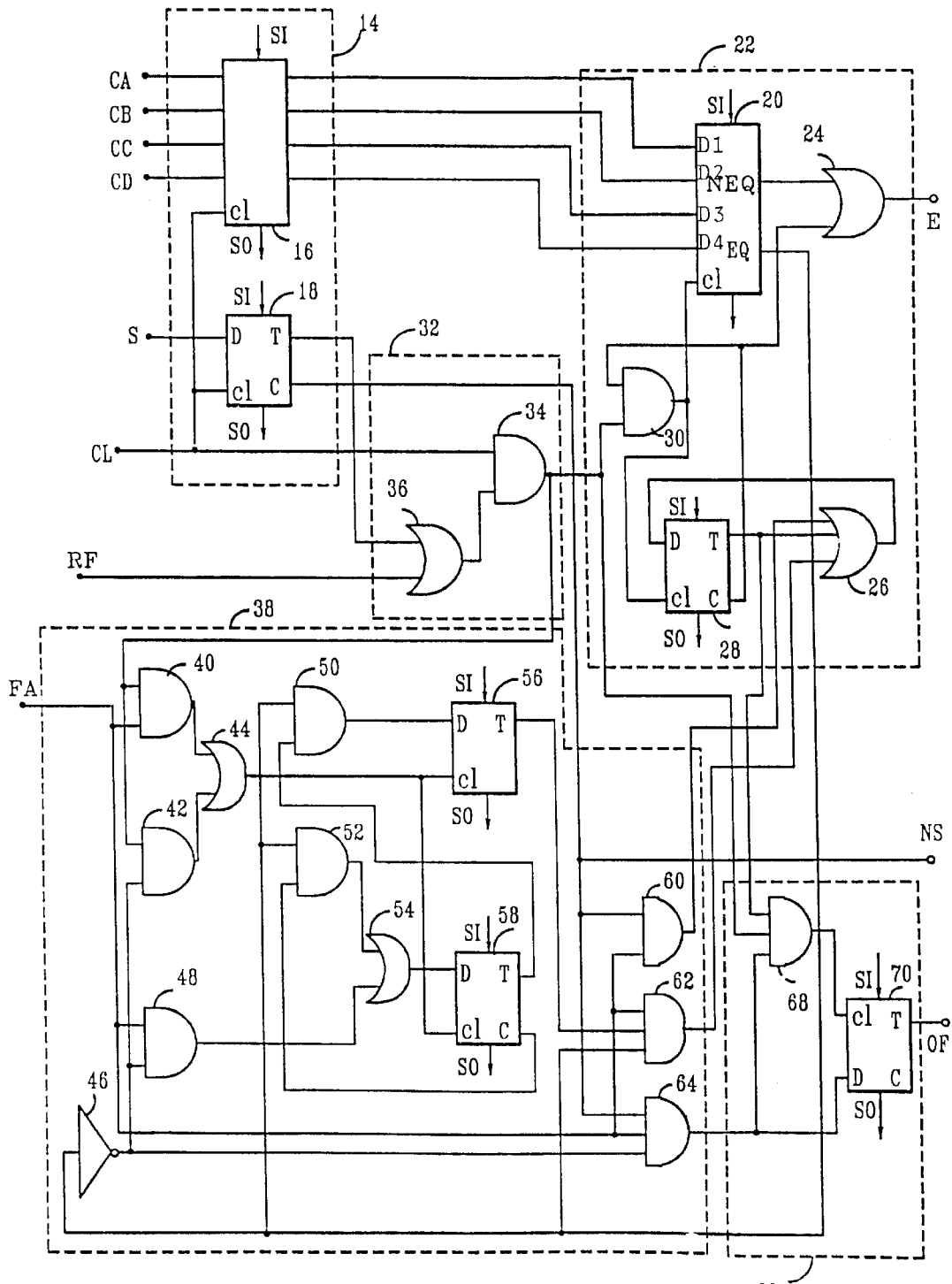
Figure 4:
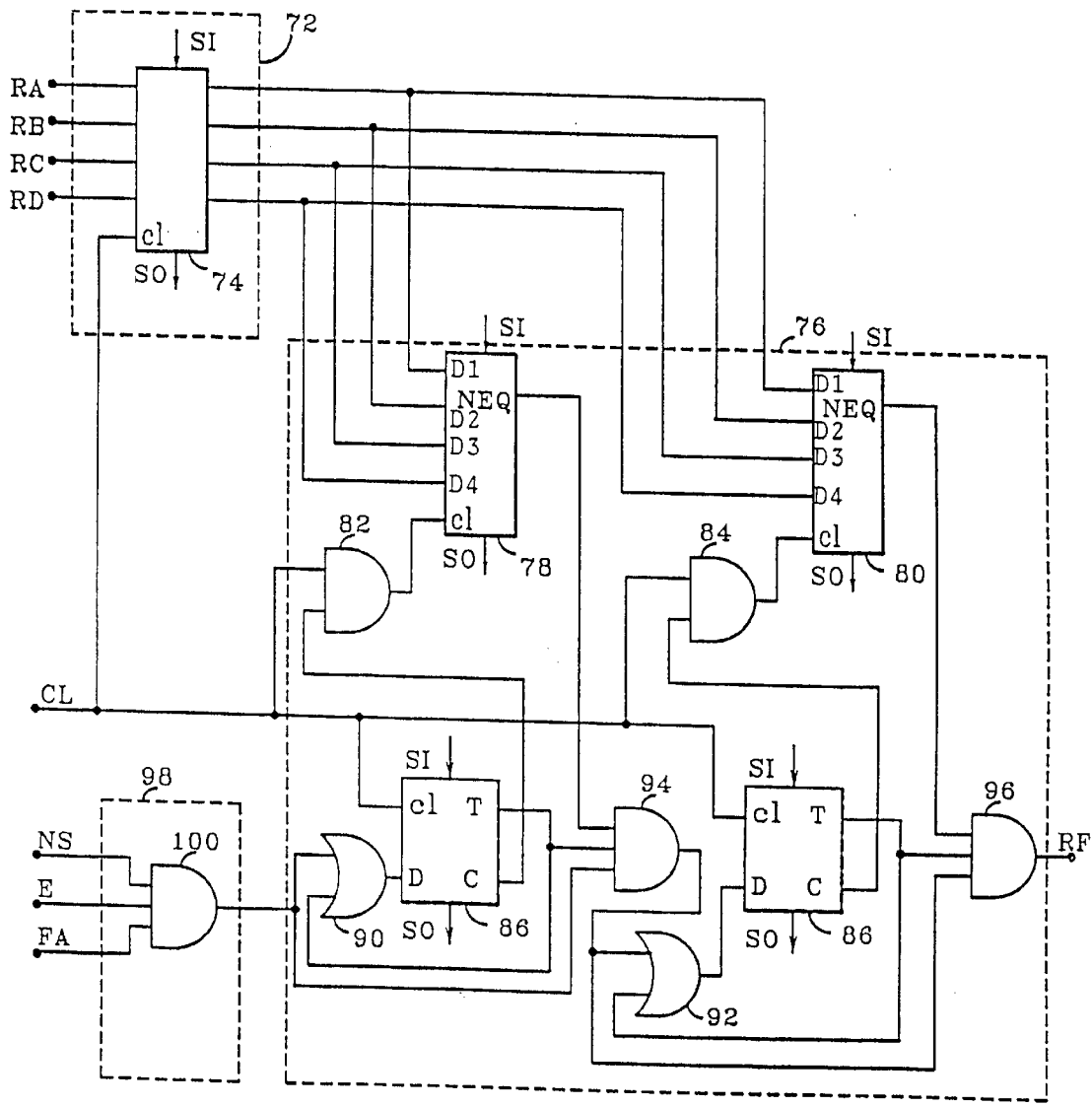
Figure 5:
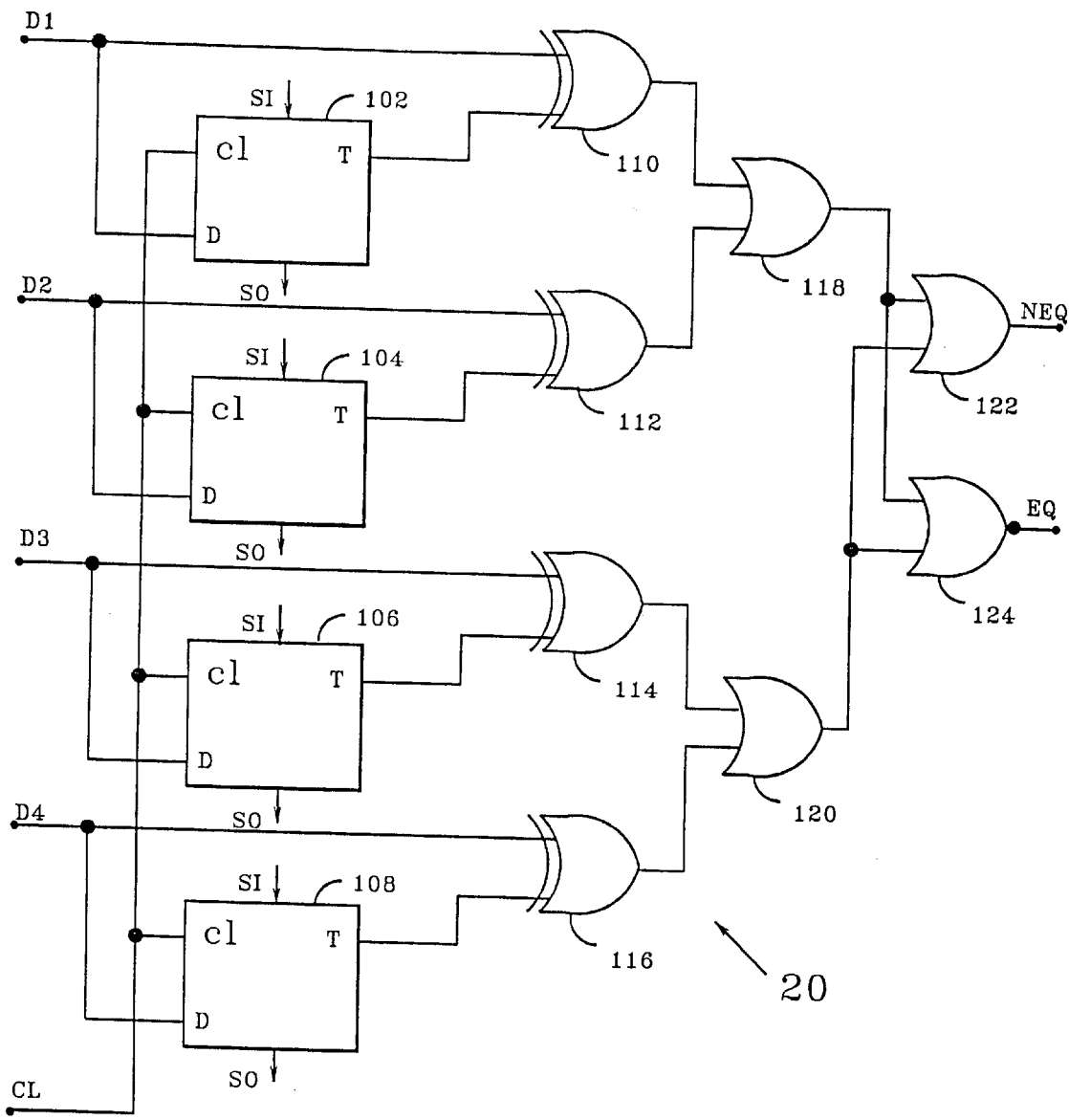
Figure 6:
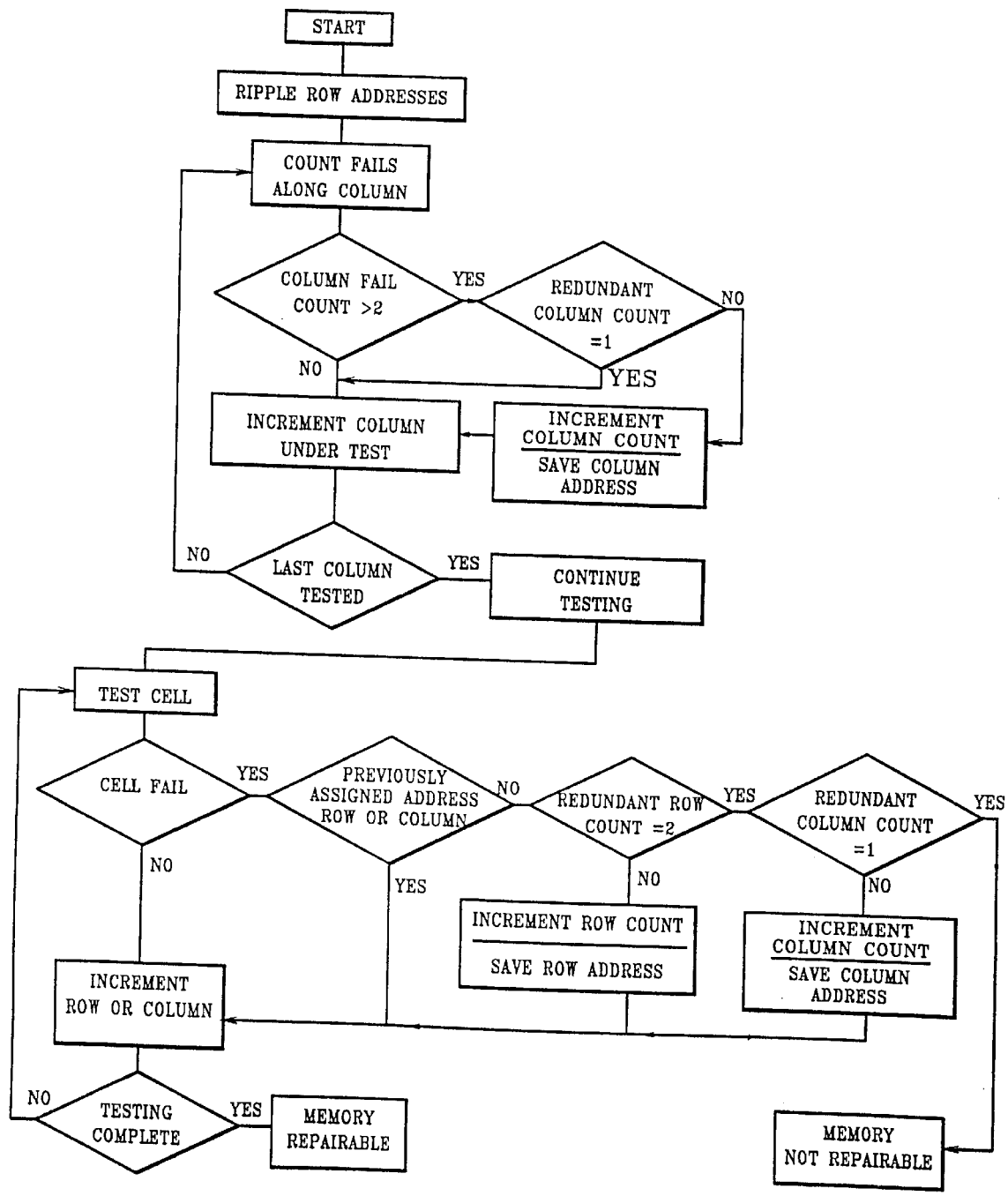
Figure 7:
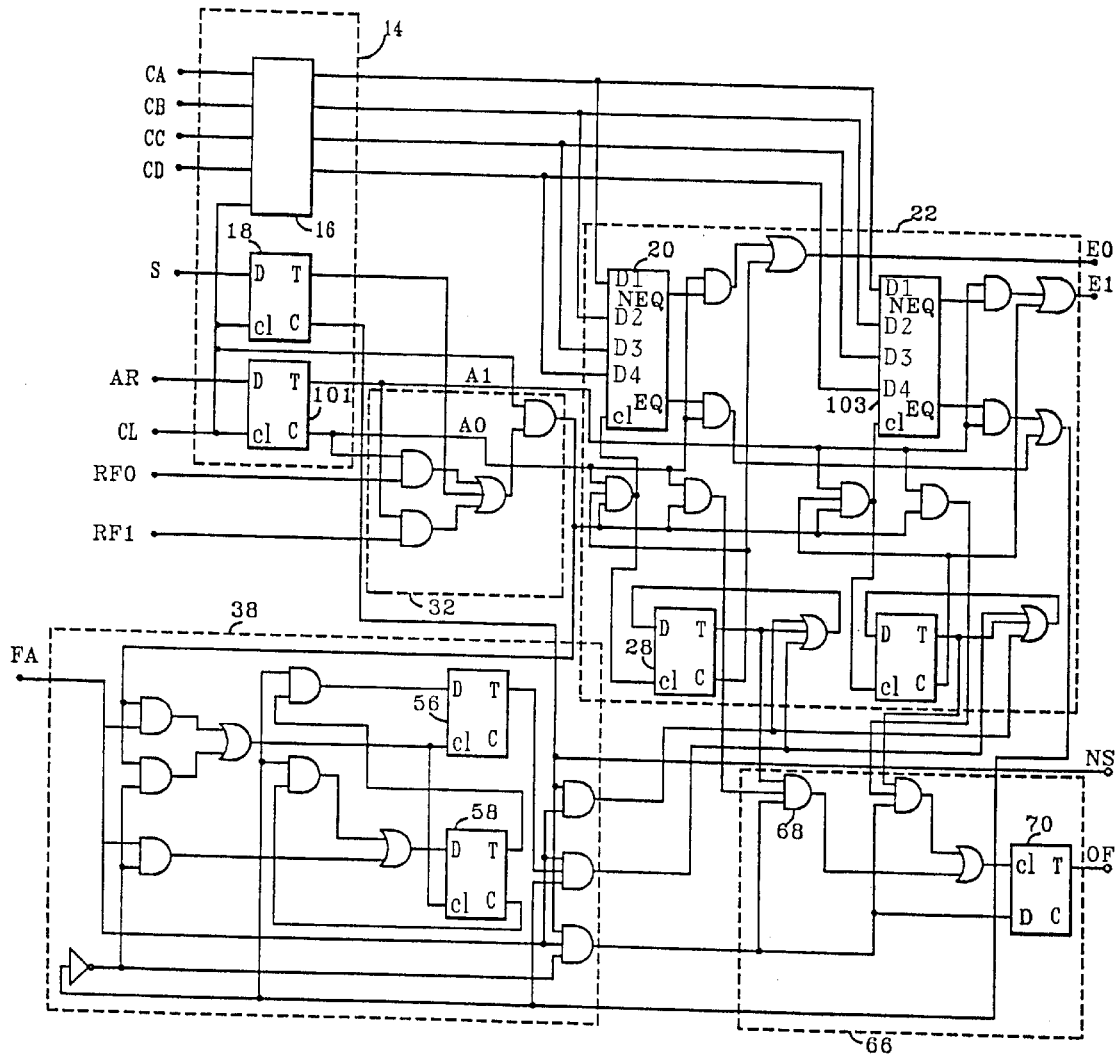
Figure 8:
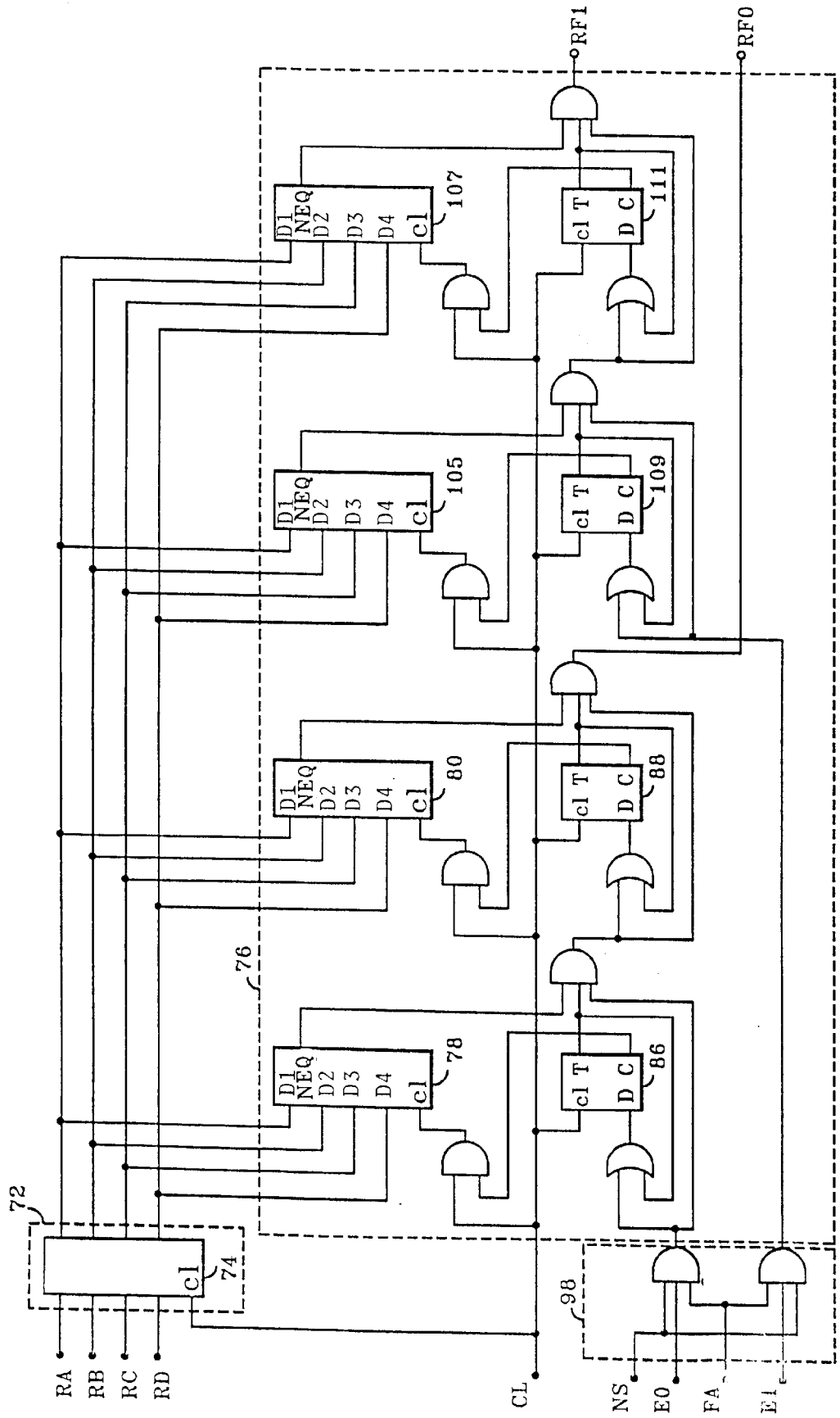

FIG. 1 is a block diagram of an array built in self test (ABIST) system of the present invention, FIG. 2 illustrates in more detail a memory array or subarray and a plurality of redundant lines of the ABIST system of FIG. 1 which may be tested by the system of the present invention, FIG. 3 is a column redundancy circuit of the present invention used to store an address of a selected faulty column line of the memory array, FIG. 4 is a row redundancy circuit of the present invention used to store addresses of a plurality of selected faulty row lines of the memory array, FIG. 5 is a circuit diagram, partly in block form, illustrating more details of registers used in the column and row redundancy circuits of FIGS. 3 and 4 of the drawings, FIG. 6 is a flow chart or diagram of an embodiment of the present invention describing a self testing method which allocates in real time redundant lines arranged in two dimensions for faulty memory cells of the array shown in FIGS. 1 and 2, FIG. 7 is a column redundancy circuit of the present invention used to store an address of selected faulty column lines of two memory arrays or subarrays, and FIG. 8 is a row redundancy circuit of the present invention used to store addresses of a plurality of selected faulty row lines located in each of two memory arrays.

BEST MODE FOR CARRYING OUT THE INVENTION

Referring to FIG. 1 of the drawings in more detail, there is shown in block diagram form an array built in self test (ABIST) system of the present invention which shows the main functional elements of the system formed on a semiconductor chip 10, which may be made of silicon. The testing system is carried out in accordance with the well known Level-Sensitive Scan Design (LSSD) techniques.

The memory chip 10 includes a memory array A having a first subarray A0 with a redundant column line RC1 and two redundant row lines RR1 and RR2, as illustrated more clearly in FIG. 2 of the drawings, along with a second subarray A1 and a redundant column line and two redundant row lines. Self test circuits interface with the array A through a multiplexer or MUX 11, multiplexing between logic or data inputs 13, 15 and 17 and the test inputs 19, 21 and 23. A test or system control circuit 25 is provided to control a data pattern generator 29 and an address counter 27 which generate the test data and address data, respectively, for the self testing of the memory array A through the multiplexer 11. The test data is written into cells of the array A of the memory chip 10 and then read out to a data compression unit 31, as is known, where it is compared with a duplicate of the test data written into the cells of the array of the memory chip 10 from the data pattern generator 29. As is also known, the results of the comparison are reduced to a single pass/fail or fault/no fault signal. These results are applied to a two dimension failed address register 33 which also receives column and row addresses of the cells of the array A in accordance with the teachings of the present invention. The system control circuit 25 provides per address read/write commands to the array A, controls address stepping, influences data pattern generation to the array A and to the data compression circuit 31 and controls result logging in the two dimension failed address register 33. During a read operation, expected data from the data pattern generator 29 is applied to the data compression circuit 31 for data output evaluation. This exercise continues until a maximum address flag is issued by the address counter 27 to the system control circuit 25 for providing a new test sequence. Three operational phases are required in the ABIST system to sufficiently test any cell address. During a first phase array input data is being set up for the next phase which includes applying the data and address signals to the inputs 19, 21 and 23 of the multiplexer 11. Then during the next phase the actual data is read out of the array A, compared in the data compression circuit 31 and the pass/fail signal provided to the two dimension fail address register 33. During a last phase the pass/fail signal is used to log in or store an address of the failed cell of the array in the two dimension fail address register. In accordance with the known LSSD techniques, a SCAN IN terminal or pin and a SCAN OUT terminal or pin are provided on the chip 10 with scan in lines SI and scan out lines SO serially interconnecting the various SRL elements of the ABIST system. Connected to the SCAN OUT terminal is any known redundancy implementation processor 35 which substitutes appropriate redundant column or row lines for faulty array column or row lines. The processor 35 may be, e.g., a laser fuse blowing device or an electrical latch setting circuit. For more information on the general aspects of the built in self address test system reference may be had to the hereinabove cited U.S. patent application entitled "Built-in Self Test for Integrated Circuits" and having Ser. No. 07/576,646.

FIG. 2 illustrates in more detail the subarray A0 of the memory array A, indicated in FIG. 1, along with the one redundant column line RC1 and the two redundant row lines RR1 and RR2 arranged orthogonally with respect to the redundant column line RC1. The subarray A0 includes a plurality of column lines C0 to Cn, which may be known memory bit lines, wherein n may be equal to 15 or more, and a plurality of row lines R0 to Rm, which may be known word lines, wherein m may be equal to 15 or more, arranged in an orthogonal direction with respect to the direction of the column lines C0 to Cn. Each of the lines C0 to Cn and R0 to Rm includes a plurality of memory cells located at the intersections of the column lines C0 to Cn and the row lines R0 to Rm and identified therein by dots 12. As will be explained hereinbelow, these cells are tested by the method and apparatus of the present invention and unacceptable or failed cells are identified as to the address location in the array and replaced by the redundant column and/or redundant row lines or the array is identified as being unrepairable. In FIG. 2, unacceptable, defective or failed cells 12 are identified by an X, with the remaining cells 12 being useful or good cells. A good memory cell is a cell which is capable of carrying out its intended data storage function without error, while a faulty memory cell does not function as intended, causing data error. It should be understood that the array and redundant column and row lines include known driver and sense amplifier circuits for writing information into and reading information out of the cells 12, and that the array A may be either a static random access memory (SRAM) or a dynamic random access memory (DRAM).

FIG. 3 is a circuit diagram in accordance with the teachings of the present invention which identifies one of the array column lines C0 to Cn of the subarray A0 of FIG. 2 having a plurality of faulty or failed cells which is to be replaced by the redundant column line RC1. The circuit of FIG. 3 includes a column re-timing circuit 14, indicated within the dashed lines, which has a first register 16 and a first latch 18. The register 16 includes inputs connected to column binary address terminals CA, CB, CC and CD and an input cl connected to a clock terminal CL. The latch 18 has a clock input cl and a data input D and a true output T and a complement output C. The clock input cl of the latch 18 is connected to the clock terminal CL and the data input D is connected to a terminal S to which is selectively applied a flag indicating the presence of a screen test performed on the array of cells 12 by the pulse pattern generator 29 of FIG. 1. The register 16 may be any known suitable register and the latch 18 is preferably any known two stage latch of the shift register latch (SRL) type used in known Level-Sensitive Scan Device (LSSD) type testing circuits.

The outputs from the first register 16 are applied to inputs of a second register 20 of a column fail address register circuit 22, indicated within dashed lines. The second register 20, which is illustrated and described hereinbelow in more detail in connection with FIG. 5 of the drawings, has an equal output EQ which indicates that the column address at the input of the second register 20 is equal to or the same as the address which is currently being stored in the second register 20 and an unequal output NEQ which indicates that the column address at the input of the second register 20 is unequal to or not the same as the column address which is currently being stored in the second register 20. The column fail address register circuit 22 also includes a first OR circuit 24 having a first input connected to the unequal output NEQ of the second register 20 and an output connected to an enable terminal E. Further included in the column fail address register circuit 22 is a second OR circuit 26, a second latch 28 and a first AND circuit 30. The true output T of the latch 28 is connected to a first input of the second OR circuit 26, with the output of the second OR circuit 26 being connected to the data input D of the latch 28, and the complement output C of the latch 28 is connected to a second input of the first OR circuit 24. The first AND circuit 30 has a first input connected to the complement output C of the second latch 28 and an output connected to the clock input cl of the latch 28 and to a clock input cl of the second register 20.

A clock control circuit 32, indicated within dashed lines, includes a second AND circuit 34 and a third OR circuit 36.

A first input of the third OR circuit 36 is connected to a row full terminal RF, with a second input terminal being connected to the true T output of the first latch 18, and an output of the OR circuit 36 is connected to a first input of the second AND circuit 34, with a second input of the AND circuit 34 being connected to the clock terminal CL. An output of the second AND circuit 34 is connected to a second input of the first AND circuit 30.

A counter circuit 38, indicated within dashed lines, includes a third AND circuit 40 having a first input connected to the output of the second AND circuit 34 and a second input connected to a cell fail or pass/fail terminal FA and a fourth AND circuit 42 having a first input also connected to the the output of the second AND circuit 34. A fourth OR circuit 44 has a first input connected to an output of the third AND circuit 40 and a second input connected to the output of the fourth AND circuit 42. An inverter circuit 46 has an input connected to the equal output EQ of the second register 20 and an output connected to a second input of the fourth AND circuit 42. A fifth AND circuit 48 also has an input connected to the output of the inverter 46, with a second input connected to the cell fail terminal FA. Sixth and seventh AND circuits, 50 and 52, respectively, each have an input connected to the equal output EQ of the second register 20. A fifth OR circuit 54 has a first input connected to an output of the fifth AND circuit 48 and a second input connected to an output of the seventh AND circuit 52. Third and fourth latches, 56 and 58, respectively, each have their clock input cl connected to the an output of the fourth OR circuit 44, with the data input D of the third latch 56 being connected to an output of the sixth AND circuit 50 and the data input D of the fourth latch 58 being connected to an output of the fifth OR circuit 54. The true output T of the fourth latch 58 is connected to a second input of the sixth AND circuit 50 and the complement output of the fourth latch 58 is connected to a second input of the seventh AND circuit 52. The counter 38 also includes an eighth AND circuit 60 having a first input connected to the complement output C of the first latch 18 of the column re-timing circuit 14 and a second input connected to the cell fail terminal FA. The complement output C of the first latch 18 is also connected to a non-screen terminal NS. The counter 38 further includes a ninth AND circuit 62 having a first input connected to the cell fail terminal FA, a second terminal connected to the true output T of the third latch 56 and a third input connected to the equal output EQ of the second register 20. An output of the eighth AND circuit 60 is connected to a second input of the second OR circuit 26 and an output of the ninth AND circuit 62 is connected to a third input of the second OR circuit 26. A tenth AND circuit 64 has a first input connected to the complement output C of the first latch 18, a second input connected to the cell fail terminal FA and a third input connected to the output of the inverter 46.

An overflow circuit 66, indicated within dashed lines, includes an eleventh AND circuit 68 having a first input connected to the true output T of the second latch 28, a second input connected to the output of the second AND circuit 34 and a third input connected to an output of the tenth AND circuit 64. A fifth latch 70 has the clock input cl connected to an output of the eleventh AND circuit 68 and a data input D connected to the output of the tenth AND circuit 64. An overflow terminal OF is connected to the true output T of the fifth latch 70. Serial scan in SI and scan out SO lines of the LSSD system are indicated passing through the registers and latches of the circuit of FIG. 3.

FIG. 4 is a circuit diagram in accordance with the teachings of the present invention which can identify faulty or failed cells in two of the array row lines R0 to Rm of FIG. 2 which can be replaced by the two redundant row lines RR1 and RR2 or can indicate that both of the redundant row lines RR1 and RR2 are to be used to replace two of the faulty array row lines R0 to Rm. The circuit of FIG. 4 includes a row re-timing circuit 72, indicated within dashed lines, having a third register 74 with a plurality of inputs connected to row address terminals RA, RB, RC and RD and a clock input cl connected to the clock terminal CL. Each binary address at the row address terminals RA, RB, RC and RD identifies one of the row lines R0 to Rm of the array of FIG. 2.

A row fail address register circuit 76, indicated within dashed lines, includes a fourth register 78 having inputs connected to the outputs of the third register 74 and a fifth register 80 also having inputs connected to the outputs of the third register 74. A twelfth AND circuit 82 has a first input connected to the clock terminal CL, with an output connected to the clock input cl of the fourth register 78, and a thirteenth AND circuit 84 has a first input connected to the clock terminal CL, with an output connected to the clock input cl of the fifth register 80. A sixth latch 86 has a clock input cl connected directly to the clock terminal CL and a seventh latch 88 also has a clock input cl connected directly to the clock terminal CL. A sixth OR circuit 90 has a first input connected to a true output T of the sixth latch 86, with an output connected to a data input D of the sixth latch 86, and a seventh OR circuit 92 has a first input connected to a true output T of the seventh latch 88, with an output connected to a data input D of the seventh latch 88. A complement output C of the sixth latch 86 is connected to a second input of the twelfth AND circuit 82 and a complement output C of the seventh latch 88 is connected to a second input of the thirteenth AND circuit 84. A fourteenth AND circuit 94 has a first input connected to a not equal output NEQ of the fourth register 78 and a second input connected to the true output T of the sixth latch 86, with an output being connected to a second input of the seventh OR circuit 92. A fifteenth AND circuit 96 has a first input connected to a not equal output NEQ of the fifth register 80, a second input connected to the true output T of the seventh latch 88 and a third input connected to the output of the fourteenth AND circuit 94. An output of the fifteen AND circuit 96 is connected to a row full terminal RF.

A row enable circuit 98, indicated within dashed lines, includes a sixteenth AND circuit 100 having a first input connected to the non-screen or not screen terminal NS, a second input connected to the enable terminal E and a third input connected to the fail terminal FA, with an output connected to a second input of the sixth OR circuit 90 and to a third input of the fourteenth AND circuit 94. Scan in SI and scan out SO lines of the LSSD system serially connected between SCAN IN and SCAN OUT terminals shown in FIG. 1 are indicated as passing through each of the registers and latches of the circuit illustrated in FIG. 4 of the drawings.

FIG. 5 of the drawing illustrates in some detail the circuit of the second register 20 of FIG. 3, with fourth and fifth registers 78 and 80 of FIG. 4 being similar to that of register 20. It can be seen that the second register 20 as shown in FIG. 5 of the drawings includes eighth, ninth, tenth and eleventh latches 102, 104, 106 and 108, respectively. Each of the latches 102, 104, 106 and 108 is connected at a clock input cl to the clock terminal CL. Data inputs D of the latches 102, 104, 106 and 108 are connected to data terminals D1, D2, D3 and D4, respectively. First, second, third and fourth EXCLUSIVE-OR circuits 110, 112, 114 and 116 have a first input connected to the data terminals D1, D2, D3 and D4, respectively. A second input of the EXCLUSIVE-OR circuits 110, 112, 114 and 116 is connected to a true output T of the latches 102, 104, 106 and 108, respectively. An eighth OR circuit 118 has a first input connected to an output of the first EXCLUSIVE-OR circuit 110 and a second input connected to an output of the second EXCLUSIVE-OR circuit 112. A ninth OR circuit 120 has a first input connected to an output of the third EXCLUSIVE-OR circuit 114 and a second input connected to an output of the fourth EXCLUSIVE-OR circuit 116. A tenth OR circuit 122 has a first input connected to an output of the eighth OR circuit 118 and a second input connected to an output of the ninth OR circuit 120. A first NOR circuit 124 has a first input connected to the output of the eighth OR circuit 118 and a second input connected to the output of the ninth OR circuit 120. An output of the tenth OR circuit 122 is connected to the not equal address terminal NEQ and an output of the NOR circuit 124 is connected to the equal address terminal EQ. Serial scan in SI and scan out SO lines of the LSSD system are indicated as passing through the second register 20 via the latches 102, 104, 106 and 108.

In the operation of the system of the present invention, each of the cells indicated in FIG. 2 of the drawings is first tested during a screen test with the use of screen signals, i.e., simple test pattern signals, from the pattern generator 29 indicated in FIG. 1 of the drawings along column lines C0 to Cn of FIG. 2 to locate cells having hard fails. Prior to the application of a first clock pulse, preferably having a voltage equal to a supply voltage of 3.5 volts, to the clock terminal CL, all of the registers and latches are preset to binary 0s, preferably to ground or a low voltage of about 0 volts, as is well known in LSSD type systems via the scan in SI and scan out SO lines, and the address, e.g., binary digits 0000, of the first column line to be tested, e.g., column line C0 of FIG. 2, is applied to the column address terminals CA, CB, CC and CD of FIG. 3 of the drawings. During the first clock pulse at the clock terminal CL, the column address is entered into or stored in the first register 16 of the column re-timing circuit 14 and appears at the outputs of the register 16, with the column address stored in the register 20 being the last column address used during the memory writing operation. The first clock pulse at the clock terminal CL is also applied to the clock input cl of the first latch 18. Furthermore, at this time the cell at the intersection of column line C0 and row line R0 of the memory subarray A0 of FIGS. 1 and 2 is being read out and compared to true data in a known manner to determine whether or not the cell C0,R0 is a hard fail. Since at this point in the testing cycle, the memory array of FIG. 2 is being tested with screen signals, a flag or a binary digit 1, which preferably has a voltage of 3.5 volts, is produced at the screen terminal S and is applied to the data input D of the first latch 18 appearing as a high voltage of about 3.5 volts at the true output T thereof after the first clock pulse is applied to the clock terminal CL. With the true output T of the first latch 18 high and applied to an input of the AND circuit 34 via the OR circuit 36 of the clock control circuit 32, each succeeding clock pulse from the clock terminal CL will appear at the output of the AND circuit 34.

When the second clock pulse is applied to the clock terminal CL, the clock pulse passes to the clock input cl of the second register 20 of the column fail address register circuit 22 through the AND circuit 30, the complement output C of the latch 28 being high, to set the address of the column line C0 into the register 20. Since the register 20 was storing the address of the last column written into during the write operation, the voltage at the not equal output NEQ of the register 18 is high and the equal output EQ is low or 0. The high voltage at terminal NEQ passes through the OR circuit 24 to the enable terminal E and the low voltage at the equal output EQ is applied to the input of the inverter 46 of the counter circuit 38. Meanwhile, the cell C0,R1 of the subarray A0 is being read out and compared to the true value to determine whether or not it is faulty, with the column address 0000 again being set into the first register 16.

Since the first cell C0,R0 of the subarray A0 is indicated as being faulty or a fail, as shown in FIG. 2, the fail terminal FA has a high voltage applied thereto. With a high voltage from the fail terminal FA applied to one input of the AND circuit 40 of the counter 38 and a clock pulse applied to the other input of the AND circuit 40, the clock pulse is also applied to the clock input cl of the latch 58, via the OR circuit 44. With the high voltage at the fail terminal FA and a high voltage at the output of the inverter 46, a high voltage is provided at the output of the AND circuit 48 which is applied to the data input D of the latch 58, via the OR circuit 54, to provide a high voltage at the true output T of the latch 58. The high voltage at the true output T of the latch 58 is applied to one of the inputs of the AND circuit 50. This high voltage essentially counts a 1 in the counter circuit 38. With the cell C0,R1 testing as a useful or good cell, as indicated in FIG. 2, the fail terminal FA is at a low voltage causing the outputs of the AND circuits 40 and 48 to be low, and, since the column address is the same as it was for the cell C0,R0, the voltage at the equal output EQ of the second register 20 is high, producing a low voltage at an input of the AND circuit 42. With the outputs of both AND circuits 40 and 42 being low, there is no clock pulse at the input cl of the latch 56. Although the AND circuit 50 has a high voltage at both of its inputs and at its output, the information in the latch 56 does not change because of the lack of a clock pulse at the clock input cl of the latch 56. It can be seen that the circuit operates in the same manner for each of the remaining cells of the first column line C0 since none of the remaining cells of this line C0 are faulty.

When the first cell C1,R0, which is not faulty, of the second column C1 is being read out and its column address is compared with the address of the first column C0 currently stored in the second register 20, the voltage at the equal output EQ goes low and the voltage at the not equal output NEQ goes high. Since the voltage at the fail terminal FA is low, the outputs of the AND circuits 40 and 48 are low. However, the output of the AND circuit 42 is high, providing a clock pulse to the clock input of both of the latches 56 and 58. With equal output EQ being low and the outputs of both AND circuits 50 and 52 low, the true outputs of both of the latches 56 and 58 are set to 0. When the column address of the failed cell C1,R1, as indicated in FIG. 2, is applied to the inputs of the second register 20, the voltage at the match or equal output EQ is high and a high voltage appears on the fail terminal FA. Thus, the clock pulse is applied to the clock inputs of both of the latches 56 and 58 through the AND circuit 40 and the OR circuit 44. Also, since the voltage at both inputs of the AND circuit 52 is high, the voltage at the true output T of the latch 58 goes high again indicating the presence of a first failed cell in the column line C1.

When the column address of the satisfactory or good cell C1,R2 is applied to the inputs of the second register 20, the voltage at the match or equal output EQ is high again but now a low voltage appears at the fail terminal FA. Thus, neither of the AND circuits 40 and 42 of the counter 38 are capable of passing the clock pulse to the latches 56 and 58. Accordingly, the output voltages of the latches 56 and 58 are not altered.

When the column address of the second faulty cell C1,R3 in the column line C1 is applied to the inputs of the second register 20, the voltage at the match output EQ is high again, and again the voltage at the fail terminal FA goes high. Thus, the clock pulse is applied to the clock inputs cl of both of the latches 56 and 58 through the AND circuit 40 and the OR circuit 44. Since the voltage at both of the inputs of the AND circuit 50 is high, the high voltage produced at the output of the AND circuit 50 causes the true output T of the latch 56 to go high. The high voltage at the true output T of the latch 56 indicates a count of 2 or the presence of two failed cells in the column line C1.

When the column address of the third failed cell C1,R4 in the column line C1 is applied to the inputs of the second register 20, the voltage at the match output EQ of the register 20 is high again, and again the voltage at the fail terminal FA goes high. With the voltage at the true output T of the latch 56 being high and with high voltages at the match output EQ and at the fail terminal FA, a high voltage appears at the output of the AND circuit 62 which is applied to the data input D of the latch 28 through the OR circuit 26 causing the true output T to go high and the complement output C to go low, thus, applying the low voltage from the complement output C of the latch 28 to an input of the AND circuit 30. With the latched low voltage applied to an input of the AND circuit 30, a clock pulse can no longer be applied to clock input of the second register 20, nor to the clock input cl of the latch 28. Thus, the column address stored in the register 20 is now identified as the faulty array column line C1 which is to be replaced by the redundant column line RC1 indicated in FIG. 2 of the drawings.

The remaining cells of the memory array are also tested column by column during the screen test and are identified as being good or faulty but the column addresses are not stored in the column fail address register circuit 22 since none of the other columns C0 to Cn has three or more failing cells and since only one column address register 20 has been provided in the column fail address register circuit 22. If desired, additional column registers of the type indicated at 20 may be included in the column fail address register circuit 22 and failed column addresses stored therein in the manner described hereinabove in connection with the storage of the address for the column C1 in the register 20. Also, it should be understood that the counter 38 may be appropriately modified, if desired, so as to store the address of a faulty column in the register 20 after two or four or more faulty cells are identified in a particular column. The number would depend upon the number of redundant row lines provided on the chip 10 for the subarray A0.

After the screen test for hard fails has been completed, additional tests, e.g., for soft fails or stuck faults, may be made in accordance with the teachings of this invention. While the additional tests are being made, the memory array is tested cell by cell along rows or columns instead of along columns only as was done during the screen test. During the additional testing the addresses of the rows R0 to Rm are applied to the row address terminals RA, RB, RC and RD shown in FIG. 4 of the drawings in much the same manner as the addresses of the column lines C0 to Cn are applied to the column address terminals CA, CB, CC and CD. During the cell by cell testing the addresses of the column lines C0 to Cn continue to be applied to the column address terminals CA, CB, CC and CD in order to provide, for masking purposes, a low voltage at the unmatch or not equal output NEQ of the second latch 20 of the column fail address circuit 22 only when cells are being read out from a to be replaced column line which has been identified in the register 20, in this instance column line C1, for replacement by the redundant column line RC1.

It should be noted in FIG. 3 of the drawings that, during the cell by cell testing, the voltage at the enable terminal E is high every time a cell is tested except when a cell in column C1 is tested. It should be further noted that since the screen test used during the column by column testing is completed, the screen terminal S now has a 0 or low voltage applied thereto. Thus, the voltage at the true output T of the latch 18 of the re-timing circuit 14 is low and the voltage at the complement output C is high. Accordingly, the latch 18 no longer controls the clock control circuit 32, instead, the high voltage from the complement output C of the latch 18 is applied to one input of each of the AND circuits 60 and 64 of the counter 38.

Referring particularly to FIG. 4 of the drawings, it should be noted that the voltage at the non-screen terminal NS which is connected to one input of the AND circuit 100 of the row enable circuit 98 is always high after the screen testing is completed. Also, it should be noted that the voltage at the enable terminal E is always high except when the cells are being read in the column line C1. Thus, a high voltage will appear at the output of the AND circuit 100 every time that a high voltage appears at the fail terminal FA and a cell is being read out from the array except when the cells in the column line C1 are being read out.

Referring now more particularly to FIGS. 2 and 4 of the drawings, prior to the application of the first clock pulse at the clock terminal CL, all of the outputs of the registers and latches are set to the binary 0. The address of the first row line R0, which, e.g., may be 1001, is applied to the row terminals RA, RB, RC and RD, and, during the first clock pulse at clock terminal Cl this address is set in the third register 74 of the row re-timing circuit 72. During the second clock pulse at the clock terminal CL, this address is transferred into the fourth register 78 of the row fail address register circuit 76. Since as indicated in FIG. 2, the first row line R0 along with the first column line C0 have a faulty or failed cell C0,R0, the voltage at the cell fail terminal FA is high. Since the voltages at all of the terminals NS, E and FA are high, the output of the AND circuit 100 of the row enable circuit 98 is also high. This high voltage applied to the data input D of the latch 86 through the OR circuit 90 causes the the true output T of the latch 86 to go high and the complement output C to go low which locks into the fourth register 78 the address of the first row line R0 having the faulty cell C0,R0. Since the remaining cells in the first row R0 are all useful or good cells, the voltage at the fail terminal FA will be low which maintains the output of the AND circuit 100 low.

When the first cell C0,R1 of the second row line R1 is read out, there is no significant change in the row fail address register circuit 76 since the first cell C0,R1 is a useful or good cell and, therefore, the voltage at the fail terminal FA is low. When the second cell C1,R1, which is faulty, of the second row R1 is read, there again is no significant change in the row fail address register circuit 76 since the column address at the inputs of the column register 20 of the column fail register circuit 22 of FIG. 3 is the same as the address stored in the column register 20. Consequently, the voltage at the unmatch or unequal output of the column register 20 is low, as is the voltage at the enable terminal E. The remaining cells in the second row line R1 do not have a fail and, therefore, there is no significant change in the row fail address register circuit 76 during the read out of these cells.

When the faulty cell C2,R2 in the third row line R2 of the array is read out, high voltages appear at the terminals NS, E and FA to provide a high voltage at the output of the AND circuit 100 of the row enable circuit 98. This high voltage is applied to the data input D of the latch 88 through the AND circuit 94 and the OR circuit 92 to cause the latch 88 to produce a high voltage at its true output T and a low voltage at its complement output C. With the complement output C of the latch 88 low, the address of the third row line R2 is locked into the fifth register 80. It should be noted that the voltage at the output of the AND circuit 94 is high since the not equal output NEQ of the register 78 is high, the true output of the latch 86 is high and the output of the AND circuit 100 is high. The high voltage from the output of the AND circuit 100 is also applied to the data input D of the latch 86, but since the true output T of the latch 86 is already high, the state of the latch 86 is not altered.

If there were no further failed cells in the array other than those in the column line C1 and in the row lines R0 and R2, which lines are identified in the registers 20, 78 and 80, the scan in and scan out lines of the LSSD test system would serially read out this information and cause a substitution of the redundant column and row lines RC1, RR1 and RR2 for the faulty array lines C1, R0 and R2. Thus, the semiconductor chip 10 of FIG. 2 would be repairable and useful in any computer system. However, when the faulty cell C3,R5, in the fourth column line C3 and the sixth row line R5 is read out, a high voltage at the output of the AND circuit 100 passing through the AND circuit 94 is applied to an input of the AND circuit 96 along with high voltages from the not equal output NEQ of the fifth register 80 and the true output T of the latch 88 applied to the other two inputs of the AND circuit 96 to produce a high voltage at row full terminal RF.

As can be seen in FIG. 3 of the drawings, with the voltage at the row full terminal RF high, a clock pulse is applied to an input of the AND circuit 68 of the overflow circuit 66 through the AND circuit 34 of the clock control circuit 32. Also, a high voltage is applied to another input of the AND circuit 68 from the true output of the latch 28 and since the column address of the faulty cell C3,R5 is not the same as the column address C1 stored in the second register 20 of the column fail address register circuit 22, the voltage at the match or equal output EQ of the register 20 is low. With the voltage at the equal output EQ of the register 20 low, a high voltage is produced at the output of the inverter 46 in the counter 38 which is applied to a further input of the AND circuit 68 and to the data input of the latch 70 through the AND circuit 64. Accordingly, with a clock pulse provided at the clock input cl of the latch 70 from the output of the AND circuit 68 and a high voltage applied to the data input D of the latch 70, the voltage at the true output T of the latch 70 goes high to provide a high voltage at the overflow terminal OF, indicating that the chip 10 is not repairable.

It should be noted that if the cells in the second column C1 had all tested as being useful or good, the address of the second column C1 would not have been locked into the second register 20 of the column fail address register circuit 22, thus, the true output of the latch 28 would still have a low voltage. Accordingly, the redundant column line RC1 could have been used as a substitute line for the fourth array column line C3 eliminating the faulty cell C3,R5 from the array and the chip 10 then would have been repairable. The address of the array column line C3 would now have been locked in the second register 20. It can be seen that with the row full terminal RF high, a clock pulse from the clock terminal CL is applied to the clock input cl of the second register 20 through the AND circuit 34 of the clock control circuit 32 and the AND circuit 30 of the column fail address register circuit 22, since the voltage at the complement output C of the latch 28 is high. However, when the column address C3 is in the second register 20 and a high voltage is applied to the fail terminal FA, the high voltage from the fail terminal FA and a high voltage from the complement output C of the latch 18 are applied to the inputs of the AND circuit 60 of the counter 38 producing a high voltage at the output of the AND circuit 60 and, thus, a high voltage at the true output T of the latch 28, with its complement output C being low. With the complement output C of the latch 28 being low, the address of the fourth column line C3 is locked in the second register 20 since the AND circuit 30 can now no longer provide a clock pulse to the clock input of the register 20.

Accordingly, it can be seen that by using redundant lines arranged in two dimensions an array having a plurality of failed cells or elements can be repaired on a real time basis to provide an array of all good cells without using a large area of the surface of the semiconductor chip in accordance with the teachings of this invention. Although in the embodiment of the invention illustrated in FIG. 3 of the drawings, only one register 20 is used in the column fail address register circuit 22, it should be understood that, if desired, two or more registers may be used in the column fail address register circuit 22 with the addition of similar logic circuitry controlling the added registers. Furthermore, if desired, three or more registers may be used in the row fail address register circuit 76 illustrated in FIG. 4 of the drawings with the addition of similar logic circuitry controlling these added registers. Also, the counter 38 may be arranged so that fewer or more than three faulty cells are required in any given column line C0 to Cn to lock in the column address in a register of the column fail address register circuit 22.

By using typical LSSD techniques, the address information stored in the two dimension failed address register indicated in FIGS. 1, 3 and 4 of the drawings is serially read out to the SCAN OUT terminal and applied to the redundancy implementation processor 35 of FIG. 1 to substitute appropriate redundant column and row lines for the identified failed array column and row lines. After the redundant lines have been substituted for the failed array column or row lines, they may be tested in a similar manner to that disclosed hereinabove. As stated hereinabove, the register 20 of the column fail address register circuit 22 provides a high voltage or a logic 1 at the output NEQ when the column address at the input of the register 20 is not the same as or not equal to that of the address stored in the register 20 and provides simultaneously a low voltage or logic 0 at the output EQ, and that the register 20 provides a low voltage at the output NEQ when the column address at the input of the register 20 is the same as or equal to the column address stored in the register 20 and simultaneously a high voltage at the equal output EQ of the register 20, thus, acting as a comparator. The operation of register 20 can be readily understood by referring to the circuit diagram of the register 20 shown in FIG. 5 of the drawings. It can be seen that when the column address stored in the latches 102, 104, 106 and 108, and, more specifically, at the true outputs T of these latches, is the same as the next column address which is applied to the data terminals D1, D2, D3 and D4, the voltage at the output of each of the EXCLUSIVE-OR circuits 110, 112, 114 and 116 is low. Thus, the voltage at the output of each of the OR circuits 118 and 120 is also low. With the voltage at the outputs of the OR circuits 118 and 120 being low, the output of the OR circuit 122 and terminal NEQ is low and the output of the NOR circuit 124 and terminal EQ is high. It can also be seen that when the two inputs of any one of the EXCLUSIVE-OR circuits 110, 112, 114 and 116 differ from each other, i.e., when the address stored in the latches 102, 104, 106 and 108 differs from or is not the same as the next column address applied to the data terminals D1, D2, D3 and D4, a high voltage or logic 1 appears at the output of at least one of the EXCLUSIVE-OR circuits 110, 112, 114 and 116 which produces a high voltage at the terminal NEQ and a low voltage at terminal EQ. The circuits of registers 78 and 80 in FIG. 4 are similar to that of register 20, except that row address information is applied to the inputs of the EXCLUSIVE-OR circuits. It should also be noted that the register 16 of the column re-timing circuit 14 of FIG. 3 includes only latches, such as the latches 102, 104, 106 and 108, with their true outputs T connected directly to the data inputs D of the register 20, and that the register 74 of the row re-timing circuit 72 of FIG. 4 also includes only latches, such as the latches 102, 104, 106 and 108, with their true outputs T connected directly to the data inputs D of the registers 78 and 80.

It is understood that the array built in self test system of the present invention does not necessarily replace the optimum or maximum number of defective cells in an array as may be found in data post processing techniques but this system does replace a high number of defective cells on a real time basis without using a large area of the surface of the semiconductor chip. In today's technology, semiconductor chips often store millions of logic and memory cells and one can ill afford to reserve space for testing circuitry. However, in view of the high cost of making these high density chips, it has been found necessary to increase the yield of the chips by using an array built in self testing (ABIST) system particularly for chips having a memory array embedded in logic circuitry.

In FIG. 6 of the drawing there is shown a flow chart or diagram, or algorithm, of the various steps used to practice one embodiment of the present invention. As seen at the top of the chart, the screen test, which is a simple test for finding hard fail cells, begins and a faulty cell is located along the column. If the column fail count along any column is greater than 2, as set by the available number of row redundant lines, the column count is set and the column address is stored or saved. If the column fail count is not greater than 2, then the column under test is incremented. If the column being tested is not the last column, then another column is tested in the same manner as was the previous column until the last column is tested. After the last column has been tested, the cells are again tested with additional test pulses using more complex test patterns, until a failed cell has been detected. If the failed cell had a previously assigned redundant address row or column, continue with the testing. If the failed cell did not have a previously assigned address row or column and the row count is not equal to 2, the row count is incremented and the row address is saved. If the row count is equal to 2 and the column count is not equal to 1, the column count is incremented and the column address is stored or saved, and further testing of the cells continues. If no further faulty cells are found, the memory array is repairable. If the row count is equal to 2 and the column count is equal to 1 and another fail cell is located in the array or subarray, the memory is not repairable.

FIGS. 7 and 8 of the drawings are circuit diagrams partly in block form illustrating another embodiment of the present invention wherein two memory arrays or two subarrays A0 and A1 on the same chip may be self tested by similar circuitry to that shown in FIGS. 3 and 4, with the same reference characters representing similar elements or circuit. As can be seen in FIG. 7, an array terminal AR is provided which is connected to a second latch 101 located in the column re-timing circuit 14. The latch 101 is used to select one of the two arrays 0 and 1 for testing. The column fail address register 22 includes a second register 103 which is used to save or store a column address of the memory array A1. Additional logic circuitry coupled to an output of the latch 101 is also provided to control the inputs and outputs of the second register 103 in much the same manner as described hereinabove in connection with the operation of the circuit shown in FIG. 3 of the drawings. Each of the column registers 20 and 103 provide outputs to separate enable terminals E0 and E1, respectively, for appropriately controlling the row enable circuit 98 of FIGS. 4 and 8.

The circuit of FIG. 8 is very similar to that of the circuit shown in FIG. 4 of the drawings with the principal difference being that third and fourth registers 105 and 107 are added to the row fail address register circuit 76 for storing or saving row addresses of the memory array A1 along with third and fourth latches 109 and 111 for controlling the inputs to the registers 105 and 107. Also, row full terminals RF0 and RF1 are provided for appropriately controlling the clock control circuit 32 for the two arrays A0 and A1.

After the array or subarray A0 or A1 is selected, the circuits of FIGS. 7 and 8 operate in a similar manner to that of the circuits of FIGS. 3 and 4.

Accordingly, it can be seen that the system of the present invention provides a chip repair solution which is generated in real time on a chip using two dimensional redundancy. This system may be used in both embedded and stand-alone random access memories, and the memories may be either static or dynamic random access memories, which are made preferably in the complementary metal oxide semiconductor (CMOS) technology. Although in the illustrated embodiments of the invention, tests were performed to first identify faulty column lines having three faulty cells therein, it should be understood that, if desired, the tests may be performed during the screen test to first identify faulty row lines, which may depend upon the amount of redundancy available and the configuration of the memory array. Furthermore, the system can be readily modified by one skilled in the art to assign redundancy to a random access memory with different numbers of arrays or subarrays and redundancy columns or redundancy rows. Also it should be noted that this invention is particularly useful when large complex and expensive chips are being fabricated with, e.g., 200 or more column lines and 200 or more row lines in the arrays. Of course, when these large arrays are being fabricated, then the number of column and row address terminals, such as CA, CB, CC and CD and RA, RB, RC and RD, has to be increased accordingly.

It should be understood that the ABIST system of the present invention is used at manufacturing test, not during memory system operation, with none of the test elements being in the performance path of high speed memory arrays. Also, this test system may be used after burn-in, which, as is known, stresses the memory to sometimes produce additional failed cells. Thus, the test system of the present invention can identify these additional failed cells and repair the array, providing improved quality and reliability. It should be further noted that the ABIST system of the present invention does not use any additional pins or terminals on the chip to provide the two dimensional redundancy testing. Furthermore, the test circuit of the present invention uses only about 1 to 2% of the surface available on current memory chips, yet, it could provide as much as double the memory yield, especially in the early life of a product.

It should also be understood that in accordance with the teachings of this invention a simple real time algorithm is used which does not require any post processing for two dimensional redundancy, and the testing may be performed as a simple screen test to locate hard fail cells followed by more complex test patterns to more fully identify all possible failing cells of the array.

While the invention has been particularly shown and described with reference to preferred embodiments thereof, it will be understood by those skilled in the art that various changes in form and details may be made therein without departing from the spirit and scope of the invention.

What is claimed is:

1. An array built in self test (ABIST) system disposed on a single semiconductor chip comprising a memory array having a plurality of column lines and a plurality of row lines and at least one redundant column line and at least one redundant row line with cells coupled to the lines at intersections thereof, first means coupled to said memory array for identifying a given number of faulty cells along each of said column lines, first register means having a number of registers equal to the number of redundant column lines, means for applying column address signals to said first register means, means coupled to said first identifying means for storing the address signals of each of the column lines having said given number of faulty cells in said first register means, second means coupled to said memory array for identifying a faulty cell along each of said row lines while masking the faulty cells having address signals of said column lines stored in said first register means, second register means having a number of registers equal to the number of redundant row lines, means for applying row address signals to said second register means, means coupled to said second identifying means for storing the address signals of each of the row lines having a faulty cell in said second register means until said second register means is filled to capacity and then storing the column line address signals of any additional faulty cells identified in said row lines in said first register means, and means coupled to said registers means for substituting said redundant column and row lines for the column and row lines having address signals stored in said first and second register means.

2. An array built in self test (ABIST) system disposed on a single semiconductor chip comprising, a memory array having a first plurality of lines, a second plurality of lines arranged orthogonally with respect to said first plurality of lines and a plurality of redundant lines with elements coupled to the lines at intersections thereof, first identifying means coupled to said memory array for identifying a given number of faulty elements along each of said lines of said first plurality of lines, first address storage means, means coupled to said first identifying means for storing address signals of each of the lines having said given number of faulty elements of said first plurality of lines in said first address storage means, second identifing means coupled to said memory array for identifying a faulty cell along each of the lines of said second plurality of lines while masking the faulty elements having address signals of said first plurality of lines stored in said first address storage means, second address storage means, means coupled to said second identifying means for storing address signals of each of the lines of the second plurality of lines having a faulty element in said second address storage means until second storage address means is filled to capacity and then storing the address signals of any additional faulty element identified along the lines of said second plurality of lines in said first address storage means, and means coupled to said first and second address storage means for substituting said plurality of redundant lines for the lines having address signals stored in said first and second address storage means.

3. An array built in self test (ABIST) system disposed on a single semiconductor chip comprising a memory array disposed on said semiconductor chip having a plurality of column lines and a plurality of row lines and at least one redundant column line and at least one redundant row line with cells coupled to the lines at intersections thereof, first means coupled to said memory array for identifying a given number of faulty cells along each of said column lines, first register means disposed on said semiconductor chip having a number of registers equal to the number of redundant column lines, means for applying column address signals to said first register means, means coupled to said first identifying means for storing the address signals of each of the column lines having said given number of faulty cells in said first register means immediately upon identification of the given number of faulty cells along each of said column lines, second means coupled to said memory array for identifying a faulty cell along each of said row lines while masking the faulty cells having address signals of said column lines stored in said first register means, second register means disposed on said semiconductor chip having a number of registers equal to the number of redundant row lines, means for applying row address signals to said second register means, means coupled to said second identifying means for storing the address signals of each of the row lines having a faulty cell in said second register means immediately upon identification of the faulty cell along each of said row lines until said second register means is filled to capacity and then storing the column line address signals of any additional faulty cells identified in said row lines in said first register means, and means coupled to said registers means for substituting said redundant column and row lines for the column and row lines having address signals stored in said first and second register means.

4. An array built in self test (ABIST) system disposed on a single semiconductor chip comprising, a memory array having a first plurality of lines, a second plurality of lines arranged orthogonally with respect to said first plurality of lines and a plurality of redundant lines with elements coupled to the lines at intersections thereof, first identifying means coupled to said memory array for identifying a given number of faulty elements along each of said lines of said first plurality of lines, first address storage means disposed on said semiconductor chip, means coupled to said first identifying means for storing address signals of each of the lines having said given number of faulty elements of said first plurality of lines in said first address storage means immediately upon identification of the given number of faulty elements along each of said lines of said first plurality of lines, second identifying means coupled to said memory array for identifying a faulty element along each of the lines of said second plurality of lines while masking the faulty elements having address signals of said first plurality of lines stored in said first address storage means, second address storage means disposed on said semiconductor chip, means coupled to said second identifying means for storing address signals of each of the lines of the second plurality of lines having a faulty element in said second address storage means until second storage address means is filled to capacity and then storing the address signals of any additional faulty element identified along the lines of said second plurality of lines in said first address storage means immediately upon identification of the faulty element along each of the lines of said second plurality of lines, and means coupled to said first and second address storage means for substituting said plurality of redundant lines for the lines having address signals stored in said first and second address storage means.

* * * * *